United States Patent
Hagiwara (10) Patent No.: US 6,812,863 B2
(45) Date of Patent: Nov. 2, 2004

(54) DECODER, DECODING METHOD, LOOK-UP TABLE, AND DECODING PROGRAM

(75) Inventor: Norihisa Hagiwara, Hachiohji (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/333,139

(22) PCT Filed: May 30, 2002

(86) PCT No.: PCT/JP02/05288

§ 371 (c)(1),
(2), (4) Date: Feb. 3, 2003

(87) PCT Pub. No.: WO02/101935

PCT Pub. Date: Dec. 19, 2002

(65) Prior Publication Data

US 2004/0012511 A1 Jan. 22, 2004

(30) Foreign Application Priority Data

Jun. 6, 2001 (JP) .................................. 2001-171740

(51) Int. Cl.[7] .................................................. H03M 7/00
(52) U.S. Cl. ........................................ 341/50; 341/51
(58) Field of Search ............................ 341/67, 65, 50, 341/52, 51

(56) References Cited

U.S. PATENT DOCUMENTS

| 5,181,031 | A | | 1/1993 | Tong et al. ............... 341/65 |
| 6,191,611 | B1 | | 2/2001 | Altaf ........................ 326/39 |
| 6,433,709 | B1 | * | 8/2002 | Oue .......................... 341/67 |
| 6,437,712 | B1 | * | 8/2002 | Aoki ......................... 341/67 |
| 6,507,293 | B2 | * | 1/2003 | Deeley et al. ............. 341/67 |
| 6,563,441 | B1 | * | 5/2003 | Gold ......................... 341/67 |
| 6,603,413 | B2 | * | 8/2003 | Igarashi et al. ........... 341/67 |
| 6,690,306 | B1 | * | 2/2004 | Acharya et al. .......... 341/65 |

FOREIGN PATENT DOCUMENTS

| JP | A 2-265329 | 10/1990 | ......... H04L/25/497 |
| JP | A 4-192744 | 7/1992 | ............. H03M/7/40 |
| JP | A 5-183443 | 7/1993 | ............. H03M/7/40 |

OTHER PUBLICATIONS

Chia–Hsing Lin et al., "Low Power Parallel Huffman Decoding", Feb. 5, 1998, Electronic Letters, vol. 34, No. 3, pp. 240–241.

* cited by examiner

Primary Examiner—Peguy JeanPierre
(74) Attorney, Agent, or Firm—Oliff & Berridge, PLC

(57) ABSTRACT

There is provided symbol association means 101 for associating each of reference places for encoded symbols with one of the symbols. Reference place identification means 102 cuts out, from an input bit sequence, each of bit sequences assigned to the symbols with a length corresponding to a maximum code length, identifies the reference place for the symbol with respect to each bit sequence cut out, and outputs the symbol corresponding to the identified reference place by referring to the symbol association means 101.

11 Claims, 7 Drawing Sheets

| BIT SEQUENCE | SEQUENCE NUMBER | INDEX |
|---|---|---|
| 000 | 0 | 3 |
| 001 | 1 | 2 |
| 010 | 2 | 1 |
| 011 | 3 | 1 |
| 100 | 4 | 0 |
| 101 | 5 | 0 |
| 110 | 6 | 0 |
| 111 | 7 | 0 |

FIG. 3 (b)

| SEQUENCE NUMBER | SYMBOL | CODE LENGTH |
|---|---|---|
| 0 | S0 | 1 |
| 1 | S1 | 2 |
| 2 | S2 | 3 |
| 3 | S3 | 3 |

| CODE BIT | SYMBOL |
|---|---|
| 1 | S0 |
| 0011 | S1 |
| 0010 | S2 |
| 000101 | S3 |
| 011 | S4 |
| 0000111 | S5 |
| 0000110 | S6 |
| 000000101 | S7 |
| 010 | S8 |
| 0000100 | S9 |
| 00000101 | S10 |
| 00011 | S11 |
| 00000100 | S12 |
| 00000011 | S13 |
| 0000011 | S14 |
| 000100 | S15 |
| 000000100 | S16 |
| 000000011 | S17 |
| 000000010 | S18 |
| 000000001 | S19 |

*FIG. 6 (b)*

| UPPER BITS | LOWER BITS | SYMBOL |
|---|---|---|
| 1xx | — | S0 |
| 001 | 1 | S1 |
| 001 | 0 | S2 |
| 000 | 101 | S3 |
| 011 | — | S4 |
| 000 | 0111 | S5 |
| 000 | 0110 | S6 |
| 000 | 000101 | S7 |
| 010 | — | S8 |
| 000 | 0100 | S9 |
| 000 | 00101 | S10 |
| 000 | 11 | S11 |
| 000 | 00100 | S12 |
| 000 | 00011 | S13 |
| 000 | 0011 | S14 |
| 000 | 100 | S15 |
| 000 | 000100 | S16 |
| 000 | 000011 | S17 |
| 000 | 000010 | S18 |
| 000 | 000001 | S19 |

FIG. 7

| BIT SEQUENCE | SEQUENCE NUMBER | SYMBOL | DIFFERENCE |
|---|---|---|---|
| 000 | 0 | S3 | 0 |
| 001 | 1 | S2 | 0 |
| 010 | 2 | S1 | 1 |
| 011 | 3 | S1 | 1 |
| 100 | 4 | S0 | 2 |
| 101 | 5 | S0 | 2 |
| 110 | 6 | S0 | 2 |
| 111 | 7 | S0 | 2 |

FIG. 8 (a)

| SYMBOL | CODE LENGTH | CODE BIT |
|---|---|---|
| S0 | 1 | 1 |
| S1 | 2 | 01 |
| S2 | 3 | 001 |
| S3 | 3 | 000 |

FIG. 8 (b)

| BIT SEQUENCE | SEQUENCE NUMBER | SYMBOL | CODE LENGTH |
|---|---|---|---|
| 000 | 0 | S3 | 3 |
| 001 | 1 | S2 | 3 |
| 010 | 2 | S1 | 2 |
| 011 | 3 | S1 | 2 |
| 100 | 4 | S0 | 1 |
| 101 | 5 | S0 | 1 |
| 110 | 6 | S0 | 1 |
| 111 | 7 | S0 | 1 |

DECODER, DECODING METHOD, LOOK-UP TABLE, AND DECODING PROGRAM

TECHNICAL FIELD

The present invention relates to a decoder, a decoding method, a look-up table, and a decoding program. In particular, the present invention is suitably applied to decode a variable length code.

BACKGROUND ART

There is a conventional method of decoding a variable length code in such a manner that a code bit is read bit by bit from an input bit sequence and symbol corresponding to a bit sequence defined in a code table is output as a decoding result when a match occurs between the read bits and the bit sequence. According to this method, decoding can be performed by using a small storage capacity if only code bits corresponding to symbols are held. However, the time required for decoding is long because of one-bit-by-one-bit reading of code bits from the input bit sequence.

On the other hand, there is a method in which, to perform high-speed decoding, symbols from which a decoding result is obtained and the code lengths of the symbols are registered in a look-up table with respect to all entries (candidates) identified by bit sequences corresponding to maximum code lengths.

Figure 8:
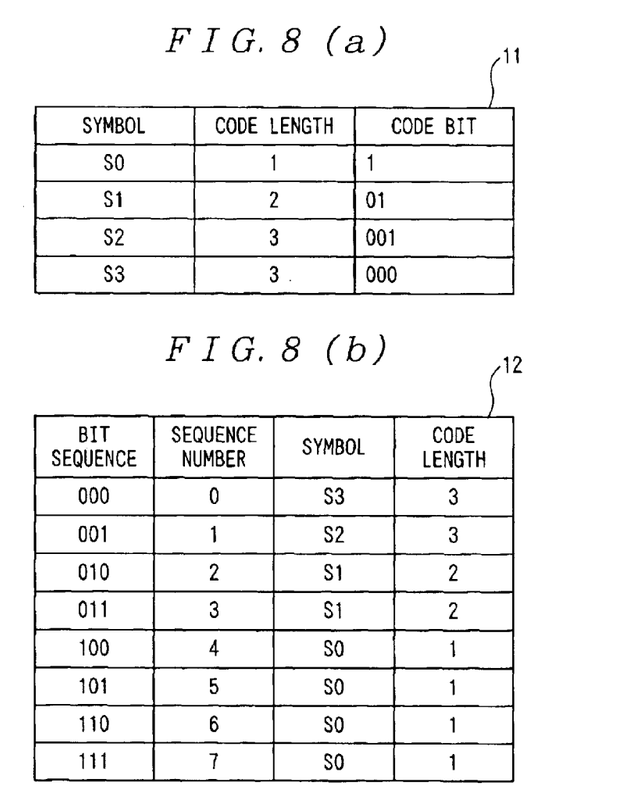
FIGS. 8(a)–8(b) are diagrams showing an example of a configuration of a conventional look-up table.

FIG. 8 is a diagram showing the configuration of such a conventional look-up table.

Referring to FIG. 8($a$), a code table 11 is defined in which, for example, a code bit "1" is assigned to a symbol S0, code bits "01" are assigned to a symbol S1, code bits "001" are assigned to a symbol S2, and code bits "000" are assigned to a symbol S3.

In this case, since the maximum code length of the code bits is 3, sequence numbers, the symbols and code lengths are registered in a look-up table 12 with respect to $2^3$ entries identified by 3-bit bit sequences, as shown in FIG. 8($b$) The sequence numbers may be numbers in decimal notation corresponding to the 3-bit bit sequences.

Bits are read in groups of three bits from the input bit sequence. Each read group of three bits is converted into a decimal number to obtain the sequence number. When the sequence number is obtained, the look-up table 12 is referred to with the sequence number used as a key to obtain the symbol corresponding to the sequence number. The symbol is output as a decoding result while the bit(s) remaining as a result of subtraction of the bits corresponding to the code length of the symbol from bit sequences for 3-bit is returned to the input bit sequence.

For example, if the input bit sequence is "1010010110 . . . ", the first three bits "101" of this bit sequence is read and this "101" is converted into a decimal number to obtain a sequence number "5". The look-up table 12 shown in FIG. 8($b$) is referred to with this sequence number "5" used as a key to obtain the symbol "S0" and the code length "1" of the symbol "S0". The symbol "S0" is output as a decoding result.

Also, the code length "1" of the symbol "S0" is compared with the maximum code length "3". Two bits "01" corresponding to the difference between the maximum code length "3" and the code length "1" of the symbol "S0" are considered unused in decoding of the symbol "S0" and are returned to the input bit sequence "0010110 . . . ".

Subsequently, the next three bits "010" are read from the input bit sequence "010010110 . . . " to which the bits have been returned, and the above-described processing is repeated.

According to the above-described conventional method, decoding can be performed only by reading one time the bit sequence corresponding to the maximum code length from the input bit sequence and, consequently, the speed of decoding can be increased.

The above-described conventional method, however, requires registering symbols and the code lengths of the symbols with respect to all entries identified by bit sequences corresponding to the maximum code length and therefore has the problem that the capacity of look-up table 12 is increased.

That is, in the example shown in FIG. 8, there are only four symbols but it is necessary to register $2^3$ entries of the symbols and the code lengths of the symbols and, therefore, the same symbol is registered in a state of being duplicated a certain number of times.

In particular, if the maximum code length is larger, the number of times one symbol is duplicated when the symbol is registered is increased, resulting in an increase in capacity of the look-up table. For example, if the maximum code length is 16 and if 100 bytes per symbol and one byte for storage of the code length are needed, a capacity of $2^{16} \times 101$ bytes is required.

It is, therefore, an object of the present invention to provide a decoder, a decoding method, a look-up table, and a decoding program enabling decoding at a higher speed with a small storage capacity.

DISCLOSURE OF THE INVENTION

A decoder provided to attain the above-described object according to the present invention is characterized by comprising symbol association means for associating each of reference places for encoded symbols with one of the symbols, and reference place identification means for identifying the reference place for each of symbols when the bit sequence assigned to the symbol and corresponding to the maximum code length is cut out.

It is thereby ensured that while the symbols are not registered in correspondence with all entries identified by the bit sequences corresponding to the maximum code length, each encoded symbol can be identified when the corresponding bit sequence is cut out, and it is possible to reduce the storage capacity while maintaining high-speed decoding performance.

A decoder according to another aspect of the present invention is characterized by comprising reference place information acquisition means for obtaining, on the basis of a bit sequence of a predetermined length, reference place information for a decoding result corresponding to a code contained in the bit sequence, and decoding result acquisition means for obtaining, on the basis of the reference place information obtained by the reference place information acquisition means, the decoding result corresponding to the code contained in the bit sequence.

It is thereby ensured that symbols and entries identified by bit sequences having a predetermined length can be associated with each other while avoiding registration of each symbol to be obtained as a decoding result in a duplicated state, thereby reducing the storage capacity while maintaining high-speed decoding performance.

A decoder according to still another aspect of the present invention, which decodes each of encoded symbols, is characterized by comprising an input buffer which reads from an input bit sequence a bit sequence having a length corresponding to the maximum code length of the symbols, a first sequence table in which reference place information for the symbols is registered with respect to each bit sequence having a length corresponding to the maximum code length of the symbols, a second sequence table in which the symbol and the code length of the symbol are registered with respect to each symbol, first reference means for obtaining the reference place information for the symbol corresponding to a code contained in the bit sequence read to the input buffer by referring to the first sequence table on the basis of the bit sequence, second reference means for obtaining the symbol corresponding to the code contained in the bit sequence and the code length of the symbol by referring to the second sequence table on the basis of the reference place information obtained by the first reference means, and return means for returning to the input bit sequence the remaining bit excluding the bit corresponding to the code length of the symbol from the bit sequence read to the input buffer.

It is thereby ensured that each symbol and the code length of the symbol can be obtained from the second sequence table if only reference places for the symbols are registered in the first sequence table by being associated with the bit sequences having a length corresponding to the maximum code length.

Therefore decoding of the variable length code can be performed by making access two times to the first sequence table and the second sequence table. Also, the need for registering each of the symbols and the code lengths of the symbols in a state of being duplicated a certain number of times by being associated with the bit sequences having a length corresponding to the maximum code length is eliminated, thereby reducing the storage capacity while maintaining high-speed decoding performance.

A decoder according to still another aspect of the present invention, which decodes each of encoded symbols, is characterized by comprising an input buffer which reads from an input bit sequence a bit sequence having a length corresponding to the maximum code length of the symbols, a first sequence table in which reference place information for the symbols is registered with respect to each bit sequence having a length corresponding to the maximum code length of the symbols, a second sequence table in which the symbol and the difference of the code length of the symbol from the maximum code length are registered with respect to each symbol, first reference means for obtaining the reference place information for the symbol corresponding to a code contained in the bit sequence read to the input buffer by referring to the first sequence table on the basis of the bit sequence, second reference means for obtaining the symbol corresponding to the code contained in the bit sequence and the difference by referring to the second sequence table on the basis of the reference place information obtained by the first reference means, and return means for returning to the input bit sequence the bit sequence read to the input buffer by the amount corresponding to the difference.

It is thereby ensured that each symbol and the difference of the code length of the symbol from the maximum code length can be obtained from the second sequence table if only reference places for the symbols are registered in the first sequence table by being associated with the bit sequences having a length corresponding to the maximum code length.

Therefore decoding of the variable length code can be performed by making access two times to the first sequence table and the second sequence table. Also, the number of bits not used in decoding of the variable length code can be obtained directly from the second sequence table, thereby reducing the number of access times, eliminating subtraction processing performed for return of a bit sequence, and further increasing the decoding speed.

According to still another aspect of the present invention, the decoder is characterized in that the first sequence table is divided into a plurality of tables in correspondence with an upper bit sequence and a lower bit sequence having a length corresponding to the maximum code length.

The number of sequences for identification of entries can be reduced thereby to further reduce the storage capacity.

A decoding method according to the present invention is characterized by comprising a step of reading from an input bit sequence a bit sequence having a length corresponding to the maximum code length, a step of obtaining, on the basis of the read bit sequence, reference place information for a symbol corresponding to a code contained in the bit sequence, a step of obtaining, from the obtained reference place information, the symbol corresponding to the code contained in the bit sequence and the code length of the symbol, a step of outputting the obtained symbol as a result of decoding of the code contained in the read bit sequence, and a step of returning to the input bit sequence the bit remaining bit as excluding the bit corresponding to the code length of the symbol from the read bit sequence.

It is thereby ensured that, even for decoding of the variable length code by reading of a length corresponding to the maximum code length, registration of only reference places for symbols associated with bit sequences having a length corresponding to the maximum code length is enough and there is no need to register the same symbol and the code length of the symbol in a state of being duplicated a certain number of times, thus reducing the storage capacity while maintaining high-speed decoding performance.

A look-up table according to the present invention is characterized by comprising a first sequence table in which reference place information for symbols is registered with respect to each of candidates for codes to be decoded, and a second sequence table in which the symbol and the code length of the symbol are registered with respect to each symbol.

It is thereby ensured that access to the symbol corresponding to each of candidates of the codes to be decoded can be made by only referring to the first sequence table one time, and the need for registration of the symbol with respect to each candidate is eliminated, thus improving the decoding speed while limiting the increase in storage capacity.

A look-up table according to another aspect of the present invention is characterized in that symbols and the differences of the code lengths of the symbols from the maximum code length are registered with respect to entries identified by bit sequences having a length corresponding to the maximum code length of the symbols.

It is thereby ensured that each decoded symbol can be output by only making access to the look-up table one time and the number of bits not used in decoding of the symbol can also be obtained thereby. Thus, it is possible to eliminate subtraction processing performed for return of the bit sequence to further increase the decoding speed.

A decoding program according to the present invention, is characterized by executing with a computer a step of reading from an input bit sequence a bit sequence having a length corresponding to the maximum code length, a step of obtaining, on the basis of the read bit sequence, reference place information for a symbol corresponding to a code contained in the bit sequence, a step of obtaining, from the obtained reference place information, the symbol corresponding to the code contained in the bit sequence and the code length of the symbol, a step of outputting the obtained symbol as a result of decoding of the code contained in the read bit sequence, and a step of returning to the input bit sequence the remaining bit excluding the bit corresponding to the code length of the symbol from the read bit sequence.

If this decoding program is installed, the speed of decoding of the variable length code can be increased and the storage capacity of the loop-up table can be reduced.

A decoding program according to another aspect of the present invention is characterized by executing with a computer a step of reading from an input bit sequence a bit sequence having a length corresponding to the maximum code length, a step of obtaining, on the basis of the read bit sequence, reference place information for a symbol corresponding to a code contained in the bit sequence, a step of obtaining, from the obtained reference place information, the symbol corresponding to the code contained in the bit sequence and the difference of the code length of the symbol from the maximum code length, a step of outputting the obtained symbol as a result of decoding of the code contained in the read bit sequence, and a step of returning to the input bit sequence the read bit sequence by the amount corresponding to the difference.

If this decoding program is installed, the number of bits not used in decoding of each symbol can be directly obtained, subtraction processing performed for return of a bit sequence can be eliminated and the decoding speed can be further increased.

BEST MODE FOR CARRYING OUT THE INVENTION

A decoder and a decoding method according to an embodiment of the present invention will be described with reference to the drawings.

Figure 1:
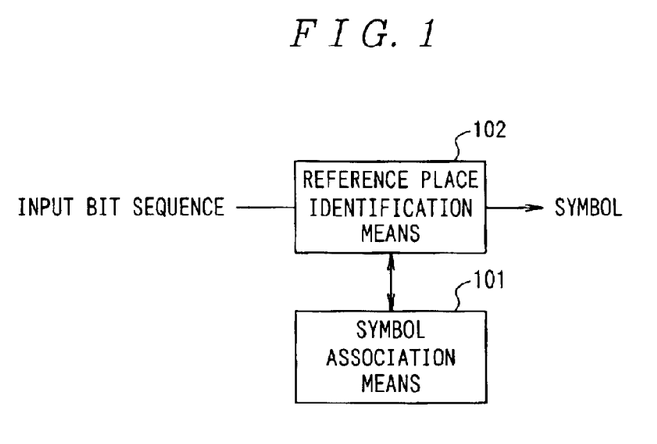
FIG. 1 is a block diagram schematically showing a configuration of a decoder according to a first embodiment of the present invention.

FIG. 1 is a block diagram schematically showing a configuration of a decoder according to a first embodiment of the present invention.

Referring to FIG. 1, the decoder has symbol association means 101 and reference place identification means 102.

The symbol association means 101 associates each of reference places for encoded symbols with one of the symbols. The reference place identification means 102 cuts out, from an input bit sequence, each of bit sequences assigned to symbols with a length corresponding to the maximum code length, and identifies the reference place for the symbol with respect to each bit sequence cut out. The reference place identification means 102 outputs the symbol corresponding to the identified reference place by referring to the symbol association means 101.

Thus, while the symbols are not registered in correspondence with all entries identified by the bit sequences corresponding to the maximum code length, each encoded symbol can be identified when the corresponding bit sequence is cut out, and it is possible to reduce the storage capacity while maintaining high-speed decoding performance.

Figure 2:
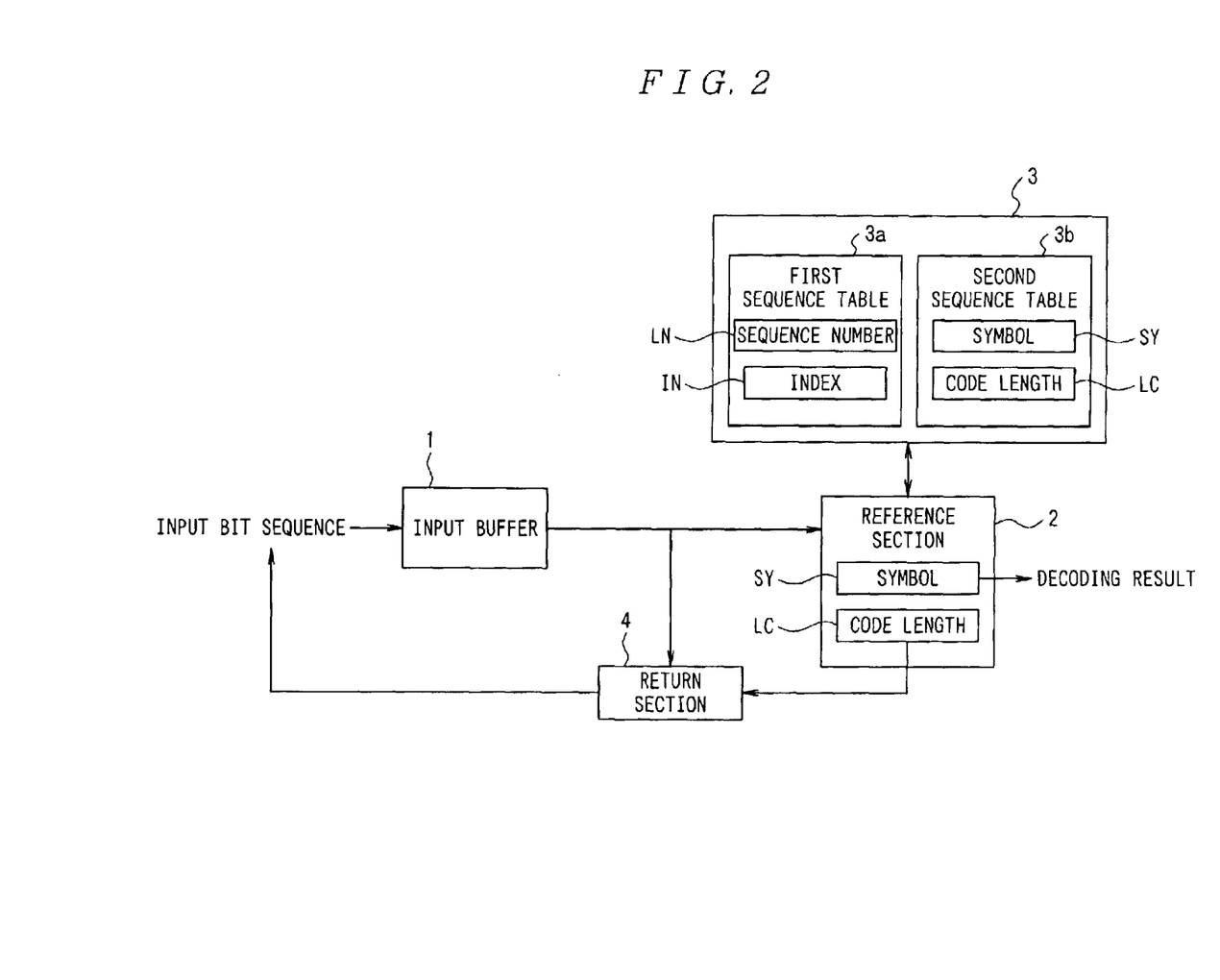
FIG. 2 is a block diagram showing a configuration of a decoder according to a second embodiment of the present invention.

FIG. 2 is a block diagram showing a configuration of a decoder according to a second embodiment of the present invention.

Referring to FIG. 2, an input buffer 1 reads a bit sequence corresponding to the maximum code length of symbols SY from an input bit sequence. A reference section 2 refers to a first sequence table 3a by using as a key a sequence number LN determined by the bit sequence read by the input buffer 1 to obtain an index (reference place) IN for the symbol SY corresponding to a code contained in the bit sequence. Further, the reference section 2 refers to a second sequence table 3b by using the index IN as a key to obtain the symbol SY corresponding to the code contained in the bit sequence read to the input buffer 1 and the code length LC of the symbol SY.

A look-up table 3 has the first sequence table 3a and the second sequence table 3b. In the first sequence table 3a, the index IN for each symbol SY to be obtained as a decoding result is registered in correspondence with the sequence number LN determined by the bit sequence having the length corresponding to the maximum code length of symbols SY. In the second sequence table 3b, the symbol SY to be obtained as a decoding result and the code length LC of the symbol are registered in correspondence with the index IN.

A return section 4 returns to the input bit sequence the remaining bit(s) excluding the bit corresponding to the code length LC of the symbol SY from the corresponding bit sequence read to the input buffer 1.

Figure 3:
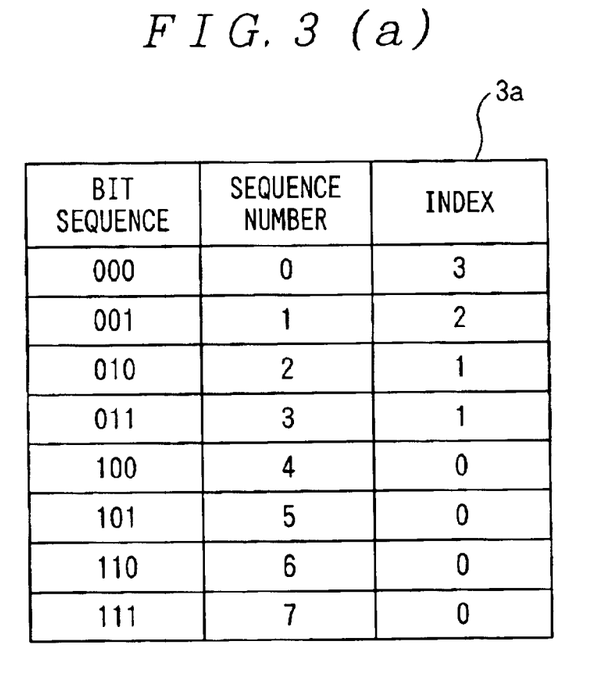
FIGS. 3(a)–3(b) are diagrams showing an example of a configuration of a look-up table according to the second embodiment of the present invention.

FIG. 3 is a diagram showing an example of a configuration of a look-up table 3 according to the second embodiment of the present invention. It is assumed here that a code bit "1" is assigned to symbol S0, code bits "01" are assigned to symbol S1, code bits "001" are assigned to symbol S2, and code bits "000" are assigned to symbol S3, as shown in FIG. 8(a).

In this case, since the maximum code length of these code bits is 3, the sequence number LN and the index IN associated with a particular entry identified by each of 3-bit bit sequences are registered in the first sequence table 3a, as shown in FIG. 3(a). The sequence numbers LN may be numbers in decimal notation corresponding to the 3-bit bit sequences.

On the other hand, in the second sequence table 3b, the symbol SY and the code length LC associated with the sequence number determined by each index IN are registered, as shown in FIG. 3(b).

As the input buffer 1 reads bit sequences in groups of three bits from an input bit sequence, the reference section 2 converts the three bits into a decimal number to obtain the sequence number LN. After obtaining the sequence number LN, the reference section 2 refers to the first sequence table 3a by using the sequence number LN as a key to obtain the index IN corresponding to the sequence number LN. After obtaining the index IN, the reference section 2 refers to the second sequence table 3b by using the index IN as a key to obtain the symbol SY corresponding to the index IN and the code length LL of the symbol SY, outputs the symbol SY as a decoding result, and outputs the code length LL to the return section 4.

The return section 4 receives the code length LL from the reference section 2 and computes the difference between the maximum code length and the code length LL received from the reference section 2. The return section 4 then returns to the input bit sequence the following part of the 3-bit bit sequence read to the input buffer 1 which part corresponds to the number of bits obtained as the difference.

Thus, indices IN are registered instead of symbols SY and the code lengths LC of the symbols by being associated with sequence numbers LN, thereby enabling access from each sequence number LN to the symbol SY if each of the symbols SY and the code lengths LC of the symbols is held only one time. Thus, the need for holding each of the symbols SY and the code lengths LC of the symbols in a state of being duplicated a certain number of times is eliminated. In the case where indices IN are registered by being associated with sequence numbers LN, it is necessary to hold each index IN in a state of being duplicated a certain number of times. However, each index IN can be set simply as a number (numeric character) and can therefore be expressed by a smaller number of bits in comparison with symbol SY which may contain a letter or a symbol as well as a numeric character. Therefore the storage capacity can be reduced in comparison with the case where symbols SY and the code lengths LC of the symbols are registered by being associated with sequence numbers LN.

Also, in the case where indices IN are registered by being associated with sequence numbers LN, decoding of the variable length code can be performed by making access two times to the first sequence table 3a and the second sequence table 3b, thus maintaining high-speed decoding performance.

Further, even in the case where accesses to the first sequence table 3a and the second sequence table 3b are made, symbols SY with a higher frequency of occurrence and the code lengths LC of the symbols may be held on a cache to reduce the access time and to thereby improve the decoding speed.

FIG. 4 is a diagram showing a decoding method according to an embodiment of the present invention.

Figure 4A:
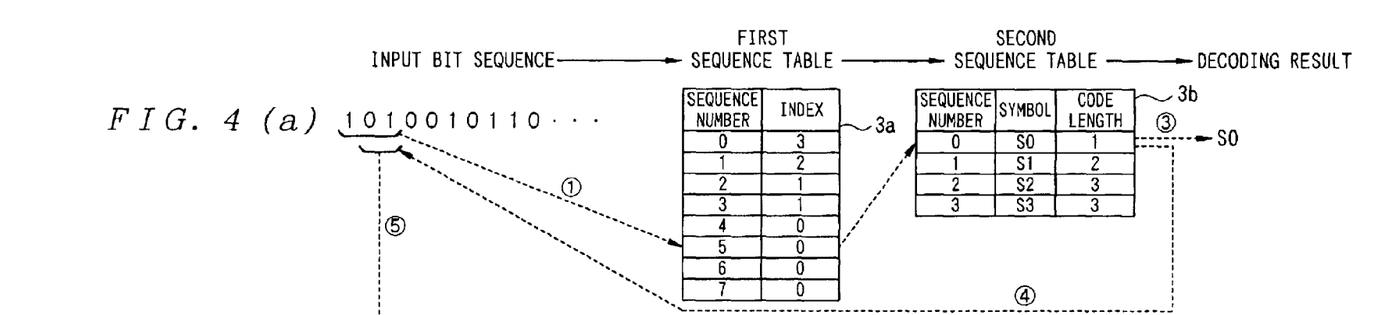
FIGS. 4(a)–4(d) are diagrams showing a decoding method according to the second embodiment of the present invention.

Referring to FIG. 4(a), if the input bit sequence is "1010010110 . . . ", the input buffer 1 reads the first group of three bits "101" from the input bit sequence and outputs these bits to the reference section 2. The reference section 2 receives the bit sequence "101" and converts the same into a decimal number to obtain the sequence number "5". The reference section 2 refers to the sequence table 3a by using the sequence number "5" as a key to obtain the index "0" ((1)).

After obtaining the index "0", the reference section 2 refers to the sequence table 3b by using the index "0" as a key to obtain the symbol "S0" and the code length "1" of the symbol "S0" ((2)), outputs the symbol "S0" as a decoding result ((3)), and outputs the code length "1" of the symbol "S0" to the return section 4 ((4)).

The return section 4 receives the code length "1" of the symbol "S0" and computes the difference=2 between the maximum code length "3" and the code length "1" of the symbol "S0". The return section 4 then returns to the input bit sequence "0010110 . . . " the following two bits "01" in the 3-bit bit sequence "101" read to the input buffer 1 ((5)).

Figure 4B:
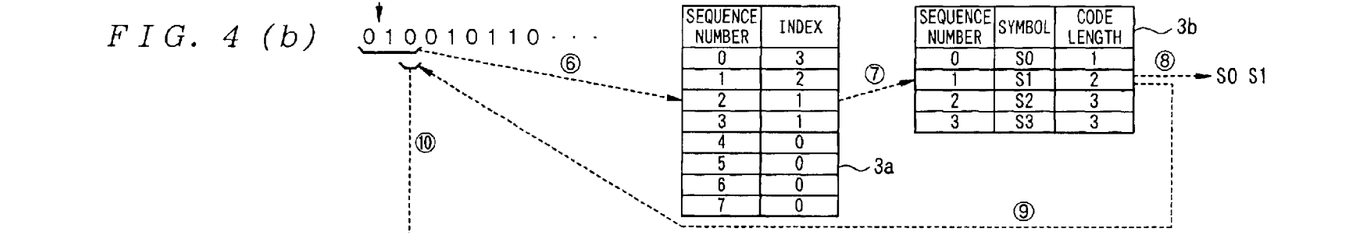

Next, the input buffer 1 reads three bits "010" from the input bit sequence "010010110 . . . " after return, as shown in FIG. 4(b), and outputs these bits to the reference section 2. The reference section 2 receives the bit sequence "010" and converts the same into a decimal number to obtain the sequence number "2". The reference section 2 refers to the sequence table 3a by using the sequence number "2" as a key to obtain the index "1" ((6)).

After obtaining the index "1", the reference section 2 refers to the sequence table 3b by using the index "1" as a key to obtain the symbol "S1" and the code length "2" of the symbol "S1" ((7)), outputs the symbol "S1" as a decoding result ((8)), and outputs the code length "2" of the symbol "S1" to the return section 4 ((9)).

The return section 4 receives the code length "2" of the symbol "S1" and computes the difference=1 between the maximum code length "3" and the code length "2" of the symbol "S1". The return section 4 then returns to the input bit sequence "010110 . . . " the following one bit "0" in the 3-bit bit sequence "010" read to the input buffer 1 ((10)).

Figure 4C:
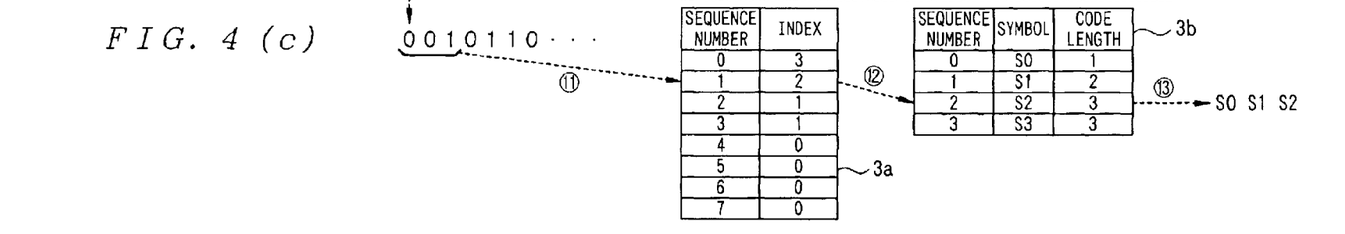

Next, the input buffer 1 reads three bits "001" from the input bit sequence "0010110 . . . " after return, as shown in FIG. 4(c), and outputs these bits to the reference section 2. The reference section 2 receives the bit sequence "001" and converts the same into a decimal number to obtain the sequence number "1". The reference section 2 refers to the sequence table 3a by using the sequence number "1" as a key to obtain the index "2" ((11)).

After obtaining the index "2", the reference section 2 refers to the sequence table 3b by using the index "2" as a key to obtain the symbol "S2" and the code length "3" of the symbol "S2" ((12)), outputs the symbol "S2" as a decoding result ((13)), and outputs the code length "3" of the symbol "S2" to the return section 4.

The return section 4 receives the code length "3" of the symbol "S2" and computes the difference=0 between the maximum code length "3" and the code length "3" of the symbol "S2". The return section 4 then returns to the input bit sequence "0010110 . . . " the following 0 bit in the 3-bit bit sequence "101" read to the input buffer 1. That is, no bit sequence is returned if the difference between the maximum code length and the code length obtained by the return section 4 is 0.

Figure 4D:
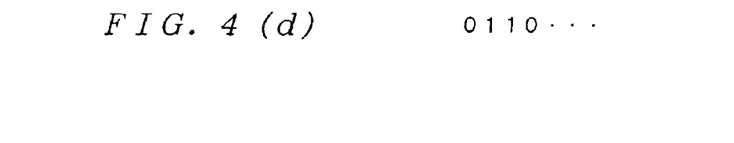

Subsequently, as shown in FIG. 4(d), decoding of the next code is performed on the input bit sequence "0110 . . . " which is the result of subtraction of the first 3-bit group "001" from the input bit sequence "0010110 . . . " shown in FIG. 4(c).

Figure 5:
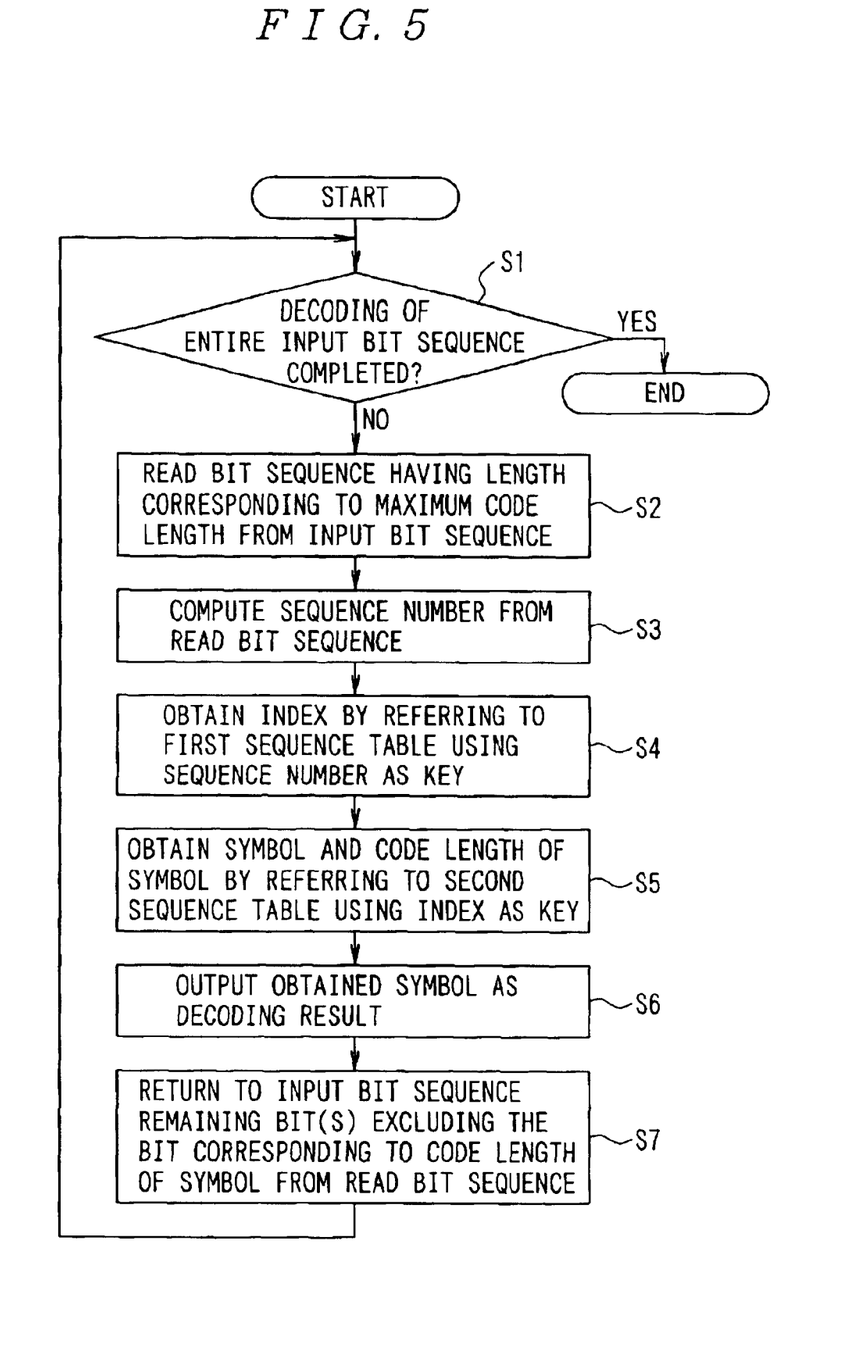
FIG. 5 is a flowchart showing the decoding method according to the second embodiment of the present invention.

FIG. 5 is a flowchart showing the decoding method according to an embodiment of the present invention.

Referring to FIG. 5, if an undecoded input bit sequence exits (step S1), a bit sequence having a length corresponding to the maximum code length is read from the input bit sequence (step S2). The sequence number LN is computed from the read bit sequence (step S3), and the first sequence table 3a is referred to by using the sequence number LN as a key to obtain the index IN (step S4).

Then, the second sequence table 3b is referred to by using the index IN as a key to obtain the corresponding symbol SY and the code length LC of the symbol (step S5), and the symbol SY is output as a decoding result (step S6).

Next, from the bit sequence read in step S2, the remaining bit(s) (or bit sequence) excluding the bit corresponding to the code length LC of the symbol SY is returned to the undecoded input bit sequence (step S7).

The first sequence table 3a maybe divided into a plurality of tables. The number of sequences necessary for identifying the index IN can be reduced thereby to further reduce the storage capacity.

Figure 6:
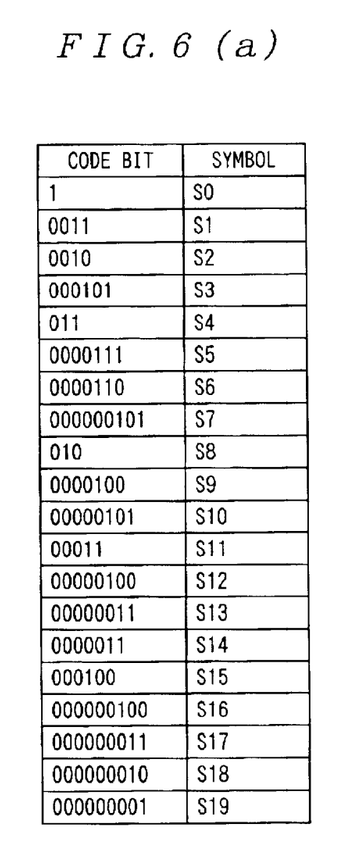
FIGS. 6(a)–6(b) are diagrams showing an example of a configuration of a look-up table according to a third embodiment of the present invention.

FIG. 6 is a diagram showing an example of a configuration of a look-up table according to a third embodiment of the present invention.

Referring to FIG. 6(a), it is assumed that code bits having a maximum code length of 9 are assigned to symbols S0 to S19.

A code table shown in FIG. 6(b) is obtained by dividing the code bits shown in FIG. 6(a) into upper three bits and lower six bits.

In the case where the code bits shown in FIG. 6(a) are divided into upper three bits and lower six bits, indices for the symbols are assigned to the divided sequences to enable identification of each symbol while reducing the storage capacity.

For example, if the upper three bits in nine bits are "011", the code can be determined as symbol S4.

Also, if the upper three bits in nine bits are "000", the code can be determined as symbol S4, the symbol can be determined by further reading the six bits and referring to the $table_{000}$.

Also, if the upper three bits in nine bits are "001", the code can be determined as symbol S4, the symbol can be determined by further reading the six bits and referring to the $table_{001}$.

The $table_{000}$ is a table prepared with respect to the symbols having "000" as the upper three bits and having the upper three bits removed in the symbols S0 to S19 defined in FIG. 6(a), and the $table_{001}$ is a table prepared with respect to the symbols having "001" as the upper three bits and having the upper three bits removed in the symbols S0 to S19 defined in FIG. 6(a).

Figure 7:
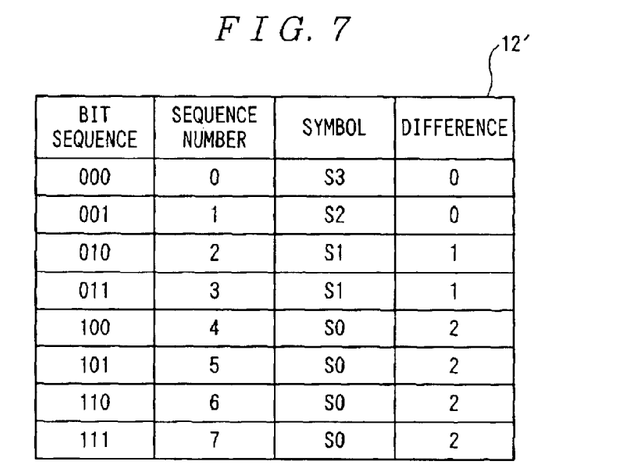
FIG. 7 is a diagram showing an example of a configuration of a look-up table according to a fourth embodiment of the present invention.

FIG. 7 is a diagram showing an example of a configuration of a look-up table 12' according to a fourth embodiment of the present invention. In the look-up table 12' according to this second embodiment, the differences of the code lengths registered in a look-up table 12 shown in FIG. 8(b) from the maximum code length are registered instead of the code lengths.

That is, it is assumed that code bits corresponding to symbols S0 to S3 are defined as shown in a code table 11 of FIG. 8(a). In this case, since the maximum code length of the code bits is 3, the sequence numbers, the symbols and the differences of the code lengths of the symbols from the maximum code length are registered in the look-up table 12' with respect to $2^3$ entries identified by 3-bit sequences, as shown in FIG. 7. For example, with respect to the sequence number 0 determined from the bit sequence "000", the code length of the symbol S3 registered by being associated therewith is 3 and, accordingly, the difference=0 between the maximum code length 3 and the code length 3 of the symbol S3 is registered. Also, for example, with respect to the sequence number 2 determined from the bit sequence "010", the code length of the symbol S1 registered by being associated therewith is 2 and, accordingly, the difference=1 between the maximum code length 3 and the code length 2 of the symbol S1 is registered.

Consequently, it is possible to recognize the number of bits to be returned by only referring to the look-up table 12' at the time of return of the bits unnecessary for decoding of each symbol, and the need for subtraction processing can be eliminated, thereby further increasing the decoding speed.

While the embodiment shown in FIG. 7 has been described with respect to the method of replacing the code lengths in the look-up table 12 of FIG. 8(b) with the differences of the code lengths from the maximum code length, this replacement may also be performed in the second sequence table 3b of FIG. 3(b).

Industrial Applicability

According to the present invention, as described above, symbols and entries identified by bit sequences having a length corresponding to the maximum code length can be associated with each other while avoiding registration of each symbol in a duplicated state, thereby reducing the storage capacity while maintaining high-speed decoding performance.

What is claimed is:

1. A decoder comprising:

symbol association means for associating each of reference places for encoded symbols with one of the symbols; and reference place identification means for identifying the reference place for each of symbols when a bit sequence assigned to the symbol and corresponding to a maximum code length is cut out.

2. A decoder comprising:

reference place information acquisition means for obtaining, on the basis of a bit sequence of a predetermined length, reference place information for a decoding result corresponding to a code contained in the bit sequence; and decoding result acquisition means fix obtaining, on the basis of the reference place information obtained by said reference place information acquisition means, symbol and a separate code length of the symbol corresponding to the code contained in the bit sequence.

3. A decoder which decodes each of encoded symbols comprising:

an input buffer which reads from an input bit sequence a bit sequence having a length corresponding to a maximum code length of the symbols;

a first sequence table in which reference place information for the symbols is registered with respect to each bit sequence having a length corresponding to the maximum code length of the symbols;

a second sequence table in which the symbol and the code length of the symbol are registered with respect to each symbol;

first reference means for obtaining the reference place information for the symbol corresponding to a code contained in the bit sequence read to said input buffer by referring to said first sequence table on the basis of the bit sequence;

second reference means for obtaining the symbol corresponding to the code contained in the bit sequence and the code length of the symbol by referring to said second sequence table on the basis of the reference place information obtained by said first reference means; and return means for returning to the input bit sequence the remaining bit excluding the bit corresponding to the code length of the symbol from the bit sequence read to said input buffer.

4. The decoder according to claim 3, wherein said first sequence table is divided into a plurality of tables in correspondence, with an upper bit sequence and a lower bit sequence having a length corresponding to the maximum code length.

5. A decoder which decodes each of encoded symbols comprising:

an input buffer which reads from an input bit sequence a bit sequence having a length corresponding to a maximum code length of the symbols;

a first sequence table in which reference place information for the symbols is registered with respect to each bit sequence having a length corresponding to the maximum code length of the symbols;

a second sequence table in which the symbol and the difference of the code length of the symbol from the maximum code length are registered with respect to each symbol;

first reference means for obtaining the reference place information for the symbol corresponding to a code contained in the bit sequence read to said input buffer by referring to said first sequence table on the basis of the bit sequence;

second reference means for obtaining the symbol corresponding to the code contained in the bit sequence and the difference by referring to said second sequence table on the basis of the reference place information obtained by said first reference means; and return means for returning to the input bit sequence the bit sequence read to said input buffer by the amount corresponding to the difference.

6. The decoder according to claim 5, wherein said first sequence table is divided into a plurality of tables in correspondence with an upper bit sequence and a lower bit sequence having a length corresponding to the maximum code length.

7. A decoding method comprising the steps of:

reading from an input bit sequence a bit sequence having a length corresponding to the maximum code length;

obtaining, on the basis of the read bit sequence, reference place information for a symbol corresponding to a code contained in the bit sequence;

obtaining, from the obtained reference place information, the symbol corresponding to the code contained in the bit sequence and the code length of the symbol;

outputting the obtained symbol as a result of decoding of the code contained in the read bit sequence; and returning to the input bit sequence a remaining bit excluding the bit corresponding to the code length of the symbol from the read bit sequence.

8. A look-up table comprising:

a first sequence table in which reference place information for symbols is registered with respect to each of candidates for codes to be decoded; and a second sequence table in which a symbol and a separate code length of the symbol are registered with respect to each symbol.

9. A look-up table wherein symbols and, separately differences of the code lengths of the symbols from a maximum code length are registered with respect to entries identified by bit sequences having a length corresponding to the maximum code length of the symbols.

10. A decoding program for executing with a computer the steps of:

reading from an input bit sequence a bit sequence having a length corresponding to the maximum code length;

obtaining, on the basis of the read bit sequence, reference place information for a symbol corresponding to a code contained in the bit sequence;

obtaining, from the obtained reference place information, the symbol corresponding to the code contained in the bit sequence and the code length of the symbol;

outputting the obtained symbol as a result of decoding of the code contained in the read bit sequence; and returning to the input bit sequence a remaining bit excluding the bit corresponding to the code length of the symbol from the read bit sequence.

11. A decoding program for executing with a computer the steps of:

reading from an input bit sequence a bit sequence having a length corresponding to a maximum code length;

obtaining, on the basis of the read bit sequence, reference place information for a symbol corresponding to a code contained in the bit sequence;

obtaining, from the obtained reference place information, the symbol corresponding to the code contained in the bit sequence and the difference of the code length of the symbol from the maximum code length;

outputting the obtained symbol as a result of decoding of the code contained in the read bit sequence; and returning to the input bit sequence the read bit sequence by the amount corresponding to the difference.

* * * * *

UNITED STATES PATENT AND TRADEMARK OFFICE
CERTIFICATE OF CORRECTION

PATENT NO. : 6,812,863 B2
DATED : November 2, 2004
INVENTOR(S) : Norihisa Hagiwara It is certified that error appears in the above-identified patent and that said Letters Patent is hereby corrected as shown below:

<u>Title page,</u>
Item [86], PCT, please delete the following:
"[86]   PCT No:  PCT/JP02/05288
        §371 (c)(1),
        (2), (4) Date:  Feb. 3, 2003"
and replace with:
-- 86]   PCT No:  PCT/JP02/05288
        §371 (c)(1),
        (2), (4)  Date:  Jan. 22, 2003 --

Signed and Sealed this

Tenth Day of May, 2005

JON W. DUDAS
*Director of the United States Patent and Trademark Office*